(12) United States Patent
Kihara et al.

(10) Patent No.: US 6,382,030 B1
(45) Date of Patent: May 7, 2002

(54) SENSOR AND METHOD OF PRODUCING THE SAME

(75) Inventors: Takashi Kihara; Yoshiyuki Ishikura; Takashi Masuda, all of Tokyo (JP)

(73) Assignee: Yamatake Corporation (JP)

( * ) Notice: Subject to any disclaimer, the term of this patent is extended or adjusted under 35 U.S.C. 154(b) by 0 days.

(21) Appl. No.: 09/423,933

(22) PCT Filed: Mar. 11, 1999

(86) PCT No.: PCT/JP99/01190
§ 371 Date: Nov. 11, 1999
§ 102(e) Date: Nov. 11, 1999

(87) PCT Pub. No.: WO99/46570
PCT Pub. Date: Sep. 16, 1999

(30) Foreign Application Priority Data

Mar. 11, 1999 (JP) .............................................. 10-61111

(51) Int. Cl.⁷ ................................................. G01L 9/12
(52) U.S. Cl. ....................................................... 73/718
(58) Field of Search ..................... 73/514.32, 514.01, 73/718, 724, 706, 756; 361/283.1, 283.3, 283.4

(56) References Cited

U.S. PATENT DOCUMENTS 5,392,651 A * 2/1995 Suzuki et al. ............ 73/514.32
5,569,960 A * 10/1996 Kumazawa et al. ......... 257/738
5,611,481 A * 3/1997 Akamatsu et al. ....... 228/123.1
5,901,046 A * 5/1999 Ohta et al. .................. 361/760
6,074,894 A * 6/2000 Suetsugu et al. ........... 438/106

FOREIGN PATENT DOCUMENTS

| JP | 58-198739 | 11/1983 |
| JP | 63-192203 | 8/1988 |
| JP | 5-264576 | 10/1993 |
| JP | 6-163935 | 6/1994 |
| JP | 6-265428 | 9/1994 |
| JP | 7-113817 | 5/1995 |

* cited by examiner

*Primary Examiner*—Helen Kwok
(74) *Attorney, Agent, or Firm*—Blakely Sokoloff Taylor & Zafman

(57) ABSTRACT

Pads 24 and 25 to be bonded to connection members are formed at positions where the pads face electrode extraction holes 4a to 4c. A bonding agent 12 low in wettability for the surfaces of electrodes 1 and 3 is used. The bonding agent 12 and high-wettability material form the surfaces of the pads 24 and 25. This can firmly bond the connection members to the electrodes 1 and 3, and can prevent the electrodes 1 and 3 from short-circuiting.

11 Claims, 11 Drawing Sheets

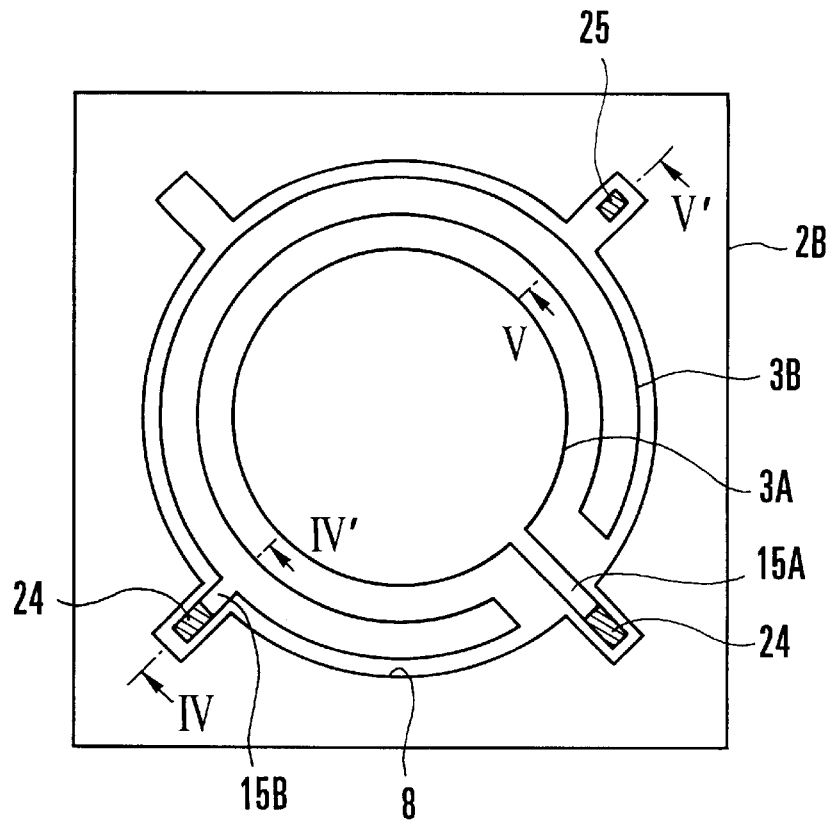
F I G. 2
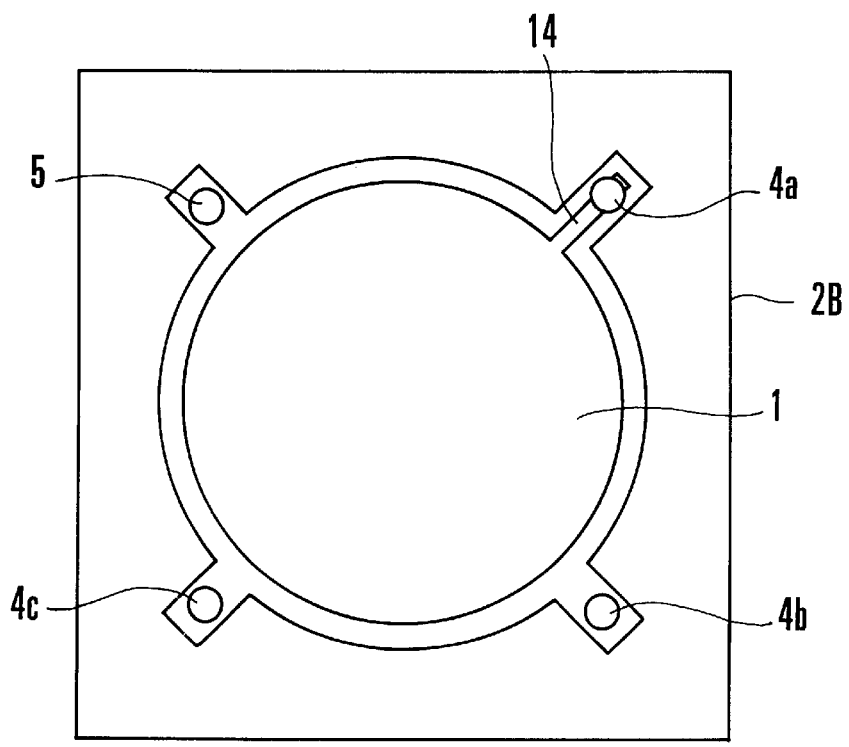
F I G. 3

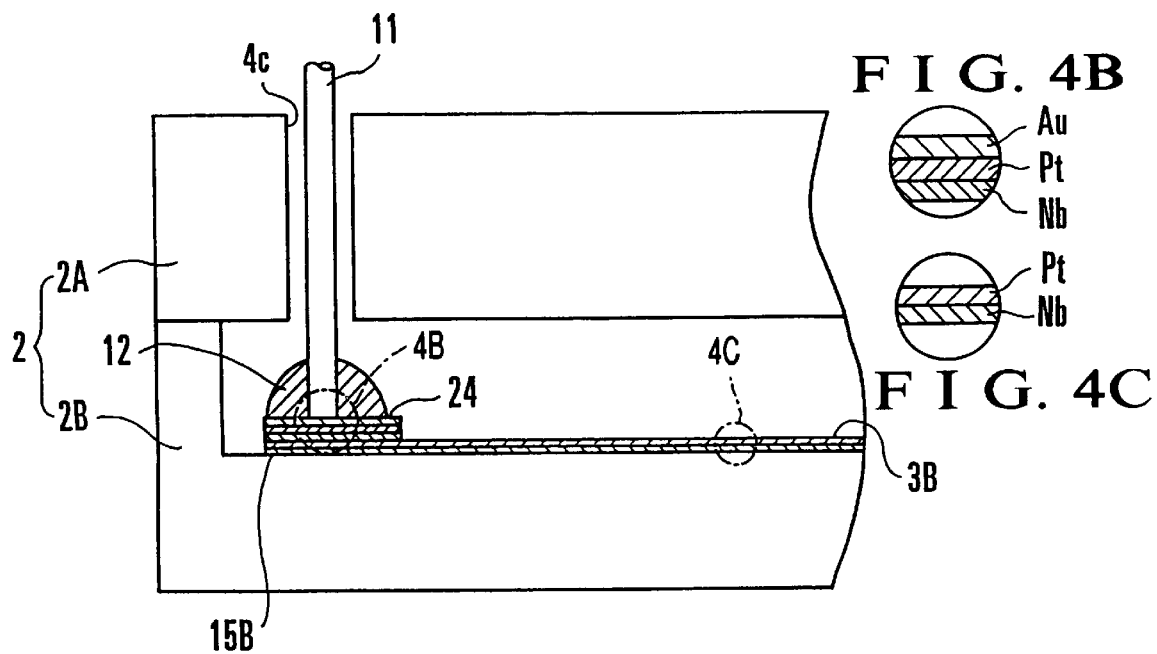
FIG. 4A
FIG. 4B
FIG. 4C
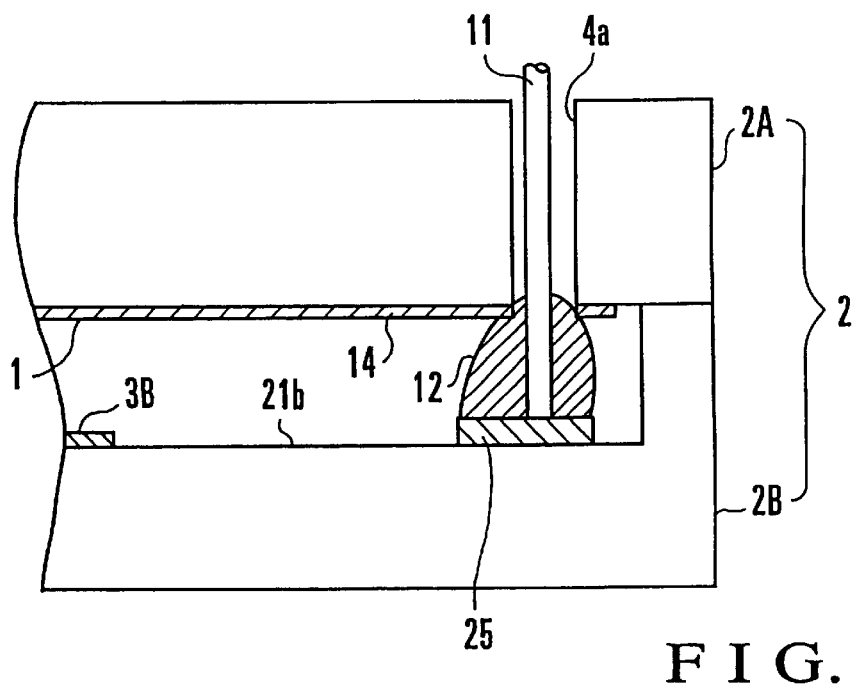
FIG. 5

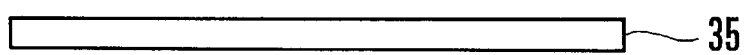
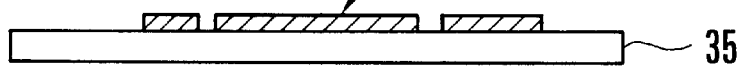
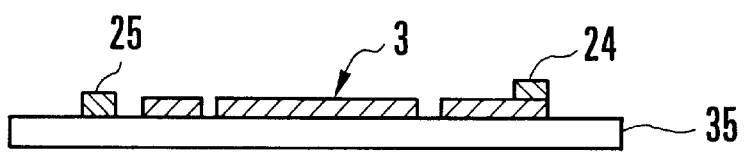
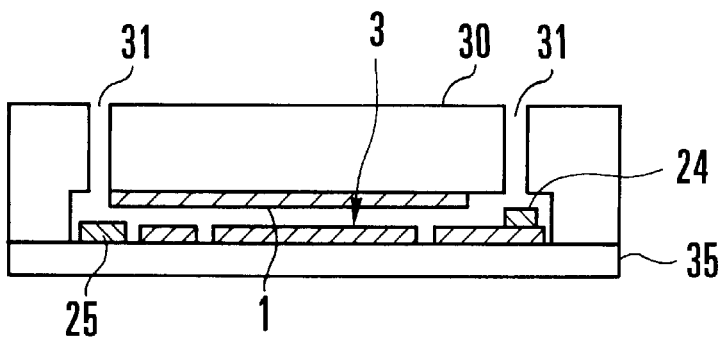
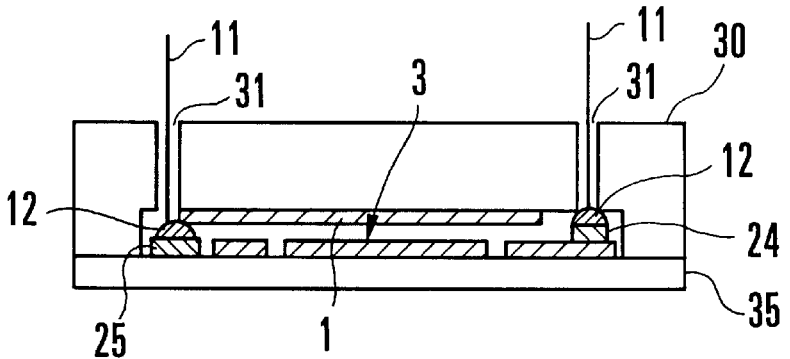

SENSOR AND METHOD OF PRODUCING THE SAME

TECHNICAL FIELD

The present invention relates to a sensor such as an electrostatic capacitance type pressure sensor for detecting the pressure of a medium to be measured or acceleration sensor for measuring an acceleration, and a method of manufacturing the same and, more particularly, to an improvement of electrode extraction structures arranged to face each other.

BACKGROUND ART

In an electrostatic capacitance type pressure sensor, a plate-like stationary electrode and movable electrode are arranged parallel and close to each other so as to face each other within the cavity of a sensor main body. A change in capacitance between the two electrodes along with displacement of a diaphragm is detected to measure the pressure of a medium to be measured. Various pressure sensors have conventionally been proposed, as disclosed in Japanese Patent Laid-Open No. 6-265428 (to be referred to as a prior art). The electrode extraction structure in such pressure sensor is generally constituted by bonding a connection pin inserted through a cavity from an electrode extraction hole to an electrode with a bonding agent such as solder or paste (prepared by kneading a metal powder with a binder)

FIG. 12 is a sectional view showing an electrostatic capacitance type pressure sensor described in the prior art. FIG. 13 is a sectional view taken along the line D–D' in FIG. 12. FIG. 14 is a sectional view taken along the line E–E' in FIG. 12.

As shown in FIG. 12, a sensor main body 202 is formed by first and second sapphire substrates 202A and 202B directly bonded to each other. A stationary electrode 201 and movable electrode 203 are arranged parallel to face each other in the sensor main body 202. This structure constitutes the electrostatic capacitance type sensor.

The first substrate 202A is thicker than the second substrate 202B. Three electrode extraction holes 204 and one atmospheric pressure inlet hole 205 are formed through the first substrate 202A in the direction of thickness. These holes 204 and 205 allow a cavity 207 formed in the sensor main body 202 to communicate with the outside.

A recess 208 is formed at the center of the inner surface of the second substrate 202B that faces the first substrate 202A. A space defined by the recess 208 and the inner surface of the first substrate 202A forms the cavity 207. The central portion of the second substrate 202B is made thin by the recess 208 to form a diaphragm 209.

The second substrate 202B is directly bonded to the first substrate 202A through a thick outer peripheral portion 210. The first and second substrates 202A and 202B are made of the same material, do not sandwich any interposition on their bonded surface, and thus are almost free from any residual stress of bonding. The first and second substrates 202A and 202B can be used without causing any change over time which deforms the diaphragm 209, and can provide stable sensor characteristics.

The movable electrode 203 is made up of a sensing electrode 203A having pressure sensitivity, and reference electrode 203B having almost no pressure sensitivity. An output difference between the two electrodes 203A and 202B can be detected to cancel the influence of a temperature change and environmental change.

The three electrode extraction holes 204 formed in the first substrate 202A, i.e., holes 204a, 204b, and 204c shown in FIG. 14 correspond to the stationary electrode 201, sensing electrode 203A, and reference electrode 203B, respectively. The electrode extraction hole 204a is formed at a position where the hole 204a extends through an electrode extraction portion 214 formed on the stationary electrode 201. The electrode extraction holes 204b and 204c are respectively formed at positions corresponding to electrode extraction portions 215A and 215B formed on the sensing electrode 203A and reference electrode 203B.

Electrode extraction will be described. FIG. 15 is an enlarged sectional view taken along the line F–F' in FIG. 13. FIG. 16 is an enlarged sectional view taken along the line G–G' in FIG. 13.

After the first substrate 202A is directly bonded to a wafer serving as a substrate material of the second substrate 202B, the wafer is divided into chips by dicing. Connection pins 211 each having a lower end coated with a solder portion (or conductive paste) 212 are sequentially inserted (in practice, press-inserted) into the electrode extraction holes 204b and 204c for the movable electrode 203, and brought into contact with the electrode extraction portions 215A and 215B of the sensing electrode 203A and reference electrode 203B, respectively. The structure is heated in this state to temporarily fuse the solder portions 212, and then the solder portions 212 are cooled and solidify. This electrically connects the sensing electrode 203A and reference electrode 203B to the connection pins 211, as shown in FIG. 15.

Further, as shown in FIG. 16, a connection pin 211 having a lower end coated with a conductive paste 213 (or solder portion) is press-inserted into the electrode extraction hole 204a for the stationary electrode 201. The stationary electrode 201 and connection pin 211 are electrically connected through the conductive paste 213.

DISCLOSURE OF INVENTION

[Problem to be Solved by the Invention]

As described above, in the conventional electrostatic capacitance type pressure sensor, the electrode 201 or 203 is mechanically, electrically connected to the connection pin 211 using the solder portion 212 or conductive paste 213. This poses the following problems.

More specifically, when the movable electrode 203 is connected to the connection pin 211 using the solder portion 212 as a bonding agent, a sufficient bonding strength cannot be obtained with low wettability of the movable electrode 203. With high wettability, the solder portion 212 flows from the electrode extraction portion 215A or 215B to short-circuit the stationary electrode 201 and movable electrode 203.

When the conductive paste 213 is used as a bonding agent, a decrease in bonding strength and connection errors occur in an excessively small amount of conductive paste 213, similar to the solder portion 212. In an excessively large amount of conductive paste 213, the conductive paste 213 contacts the stationary electrode 201 to short-circuit the stationary electrode 201 and movable electrode 203.

On the other hand, when the stationary electrode 201 is connected to the connection pin 211, the stationary electrode 201 is not formed on the abutment surface of the connection pin 211, as shown in FIG. 16. In other words, the stationary electrode 201 is formed on the inner surface of the sensor main body 202 in which the electrode extraction hole 204a is formed. For this reason, the solder portion is difficult to electrically connect the stationary electrode 201.

The stationary electrode 201 may be somehow electrically connected using the conductive paste 213. However, similar to the movable electrode 203, the stationary electrode 201 may short-circuit with the movable electrode 203 or fail in connection depending on the amount of conductive paste 213.

[Means of Solution to the Problem]

The present invention has been made to overcome the conventional drawbacks, and has as its object to realize a sensor having a high bonding strength between an electrode and a connection member such as a connection pin.

It is another object of the present invention to realize a sensor capable of preventing electrodes from short-circuiting with each other.

It is still another object of the present invention to realize a sensor capable of reliably electrically connecting the connection member and electrode.

It is still another object of the present invention to realize a sensor high in yield and excellent in mass production.

To achieve the above objects, a sensor according to the present invention is characterized by comprising a sensor main body (2) in which a cavity (7) which communicates with outside through a plurality of electrode extraction holes (4a, 4b, 4c, 31, 104a, 104b, 104c, 131) is formed, a pair of electrodes (1, 3) arranged in the cavity to face each other, a plurality of connection members (11, 12, 111) which are inserted in the cavity through the electrode extraction holes and are electrically connected to corresponding electrodes, and pads (24, 25) which are formed in the cavity at positions where the pads face the electrode extraction holes, are bonded to corresponding connection members, and are made of a conductive material, wherein wettability of each connection member for a pad surface is higher than wettability of the connection member for an electrode surface. Since the connection member has high wettability for the pad surface, part of the fused connection member spreads on the entire pad surface to firmly bond the connection member to the pad. As a result, the connection member can be reliably electrically connected to the electrode. To the contrary, the connection member has low wettability for the electrode surface. Even if part of the fused connection member overflows from the pad, it hardly flows along the electrode surface. For this reason, the connection member does not contact both a pair of electrodes, and does not short-circuit them.

As an arrangement of the sensor, the pad (24) is formed on a surface of the electrode (3, 3A, 3B, 15A, 15B) present at a position where the electrode faces the electrode extraction hole (4a, 4b, 4c, 31), and the electrode is connected to a corresponding connection member (11, 12) through the pad. With this structure, the electrode can be extracted through the connection member in a direction different from the electrode direction.

In this case, an arrangement of the connection member comprises a connection pin (11) inserted through the cavity from the electrode extraction hole, and a bonding agent (12) for bonding the connection pin to the pad. Since the connection member is formed by bonding the connection pin to the pad with the bonding agent, the connection member can be reliably electrically connected to the electrode.

When the bonding agent is made of Sn—Ag, the sensor may be constituted using Pt as the material of the electrode surface and Au as the material of the pad surface. This is because the wettability of Sn—Ag is high for Au and low for Pt.

As another arrangement of the sensor, the pad (25) is formed at a position where the pad faces the electrode extraction hole, on a surface (21b) opposite to the electrode extraction hole side among inner surfaces (21a, 21b) of the sensor main body forming the cavity, and the electrode (1) formed on the electrode extraction hole side contacts a corresponding connection member (11, 12). With this structure, the electrode can be extracted through the connection member in the same direction as the electrode direction.

In this case, another arrangement of the connection member comprises a connection pin (11) inserted into the cavity from the electrode extraction hole, and a bonding agent (12) for bonding the connection pin to the pad and the electrode formed on the electrode extraction hole side. Since the pad having high in wettability for the bonding agent is arranged at an opposite position, the bonding agent can reach the electrode surface through the connection pin to reliably electrically connect the electrode and connection pin. This reduces connection errors.

When the bonding agent is made of Sn—Ag, the sensor may be constituted using Pt as the material of the electrode surface and Au as the material of the pad surface.

Still another example of the connection member in the sensor is made of solder for filling a space above the pad in the cavity and the electrode extraction hole (104a, 104b, 104c, 131). Since the electrode extraction hole is filled with the solder which is used as the connection member, the connection member can be easily formed.

When the solder is made of Sn—Ag, the sensor may be constituted using Pt as the material of the electrode surface and Au as the material of the pad surface.

In this case, the electrode extraction hole may be tapered to decrease an inner diameter from an outer surface to inner surface of the sensor main body. This tapered shape can smoothly flow the fused solder.

In this case, at least part of an inner surface of the electrode extraction hole may be covered with a material having high wettability for the solder. This can easily flow the fused solder through the electrode extraction hole.

A sensor manufacturing method is characterized by comprising the steps of preparing a member in which a cavity (7) communicating with outside through a plurality of electrode extraction holes (104a, 104b, 104c, 131) is formed in a sensor main body (2), a pair of electrodes (1, 3) are arranged in the cavity to face each other, and a plurality of pads (24, 25) made of a conductive material higher in wettability for solder (111) than for the electrode are formed in the cavity at positions where the pads face the electrode extraction holes, flowing the fused solder from the electrode extraction holes onto the pads in the cavity to fill a space above the pads in the cavity and the electrode extraction holes with the fused solder, and cooling the fused solder to extract the electrodes in the cavity through the solder filled in the electrode extraction holes. This can form a sensor using the solder filling the electrode extraction hole as a connection member.

In this case, the sensor manufacturing method may further comprise disposing a solder lump (111A) having a predetermined size at an inlet of each electrode extraction hole on an outer surface of the sensor main body, heating and fusing the solder lump, and flowing the solder lump from the electrode extraction hole.

The sensor manufacturing method further comprises attaching a jig (127) around the inlet of the electrode extraction hole, and disposing the solder lump. The solder lump can be reliably disposed at a desired position.

The sensor manufacturing method further comprises increasing an external pressure of the sensor main body to be higher than an internal pressure of the cavity, and heating and fusing the solder. The fused solder can be forcibly flowed onto the pad.

In this manufacturing method, when the pad (24) is formed on a surface of the electrode (3A, 3B, 15A, 15B) present at a position where the electrode faces the electrode extraction hole, the solder is bonded to the pad. The electrode on an opposite side to the electrode extraction hole side can be extracted through the connection member made of the solder.

To the contrary, when the pad (25) is formed at a position where the pad faces the electrode extraction hole, on a surface (21b) opposite to the electrode extraction hole side among inner surfaces (21a, 21b) of the sensor main body forming the cavity, the solder is brought into contact with the electrode (1) formed on the electrode extraction hole side. Hence, the electrode on the electrode extraction hole side can be extracted through the connection member made of the solder.

In this manufacturing method, the electrode extraction hole can be formed using laser machining to taper the electrode extraction hole.

BRIEF DESCRIPTION OF DRAWINGS

FIG. 2 is a sectional view taken along the line II–II' in FIG. 1;

FIG. 3 is a sectional view taken along the line III–III' in FIG. 1;

FIG. 4a is an enlarged sectional view taken along the line IV–IV' in FIG. 2;

FIG. 4b is an enlarged sectional view of a portion of FIG. 4a.

FIG. 4c is an enlarged sectional view of a portion of FIG. 4a.

FIG. 5 is an enlarged sectional view taken along the line V–V' in FIG. 2;

FIGS. 7(a) to 7(e) are sectional views, respectively, showing steps subsequent to FIG. 6;

BEST MODE OF CARRYING OUT THE INVENTION

Preferred embodiments of the present invention will be described in detail below.

(First Embodiment)

Figure 1:
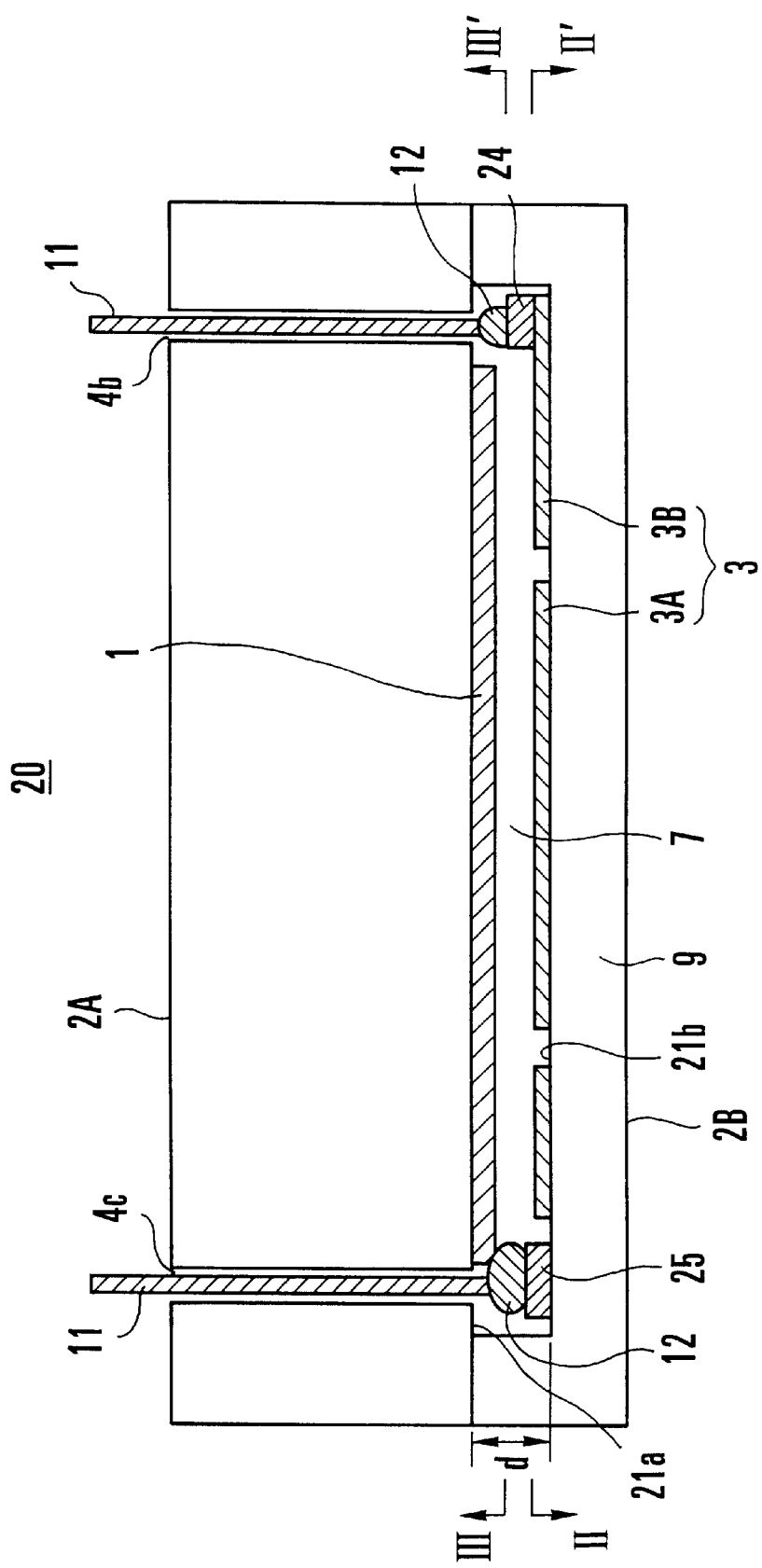
FIG. 1 is a sectional view showing a sensor according to the first embodiment of the present invention.

FIG. 1 is a sectional view showing a sensor according to the first embodiment of the present invention. FIG. 2 is a sectional view taken along the line II–II' in FIG. 1. FIG. 3 is a sectional view taken along the line III–III' in FIG. 1. FIG. 4a is an enlarged sectional view taken along the line IV–IV' in FIG. 2. FIG. 5 is an enlarged sectional view taken along the line V–V' in FIG. 2. FIG. 1 shows an electrostatic capacitance type pressure sensor to which the present invention is applied.

A pressure sensor 20 comprises a sensor main body 2 formed by directly bonding first and second substrates 2A and 2B made of sapphire, silicon, glass, alumina, or the like. A cavity 7 is formed in the sensor main body 2. Three electrode extraction holes 4 (4a, 4b, 4c) communicating with the cavity 7, and one atmospheric pressure inlet hole 5 extend through the first substrate 2A.

The cavity 7 is formed by a space defined by the first substrate 2A and a recess 8 formed at the center of the inner surface of the second substrate 2B. The central portion of the second substrate 2B is made thin by the recess 8 to form a diaphragm 9. A pair of stationary electrode 1 and movable electrode 3 (3A and 3B) are respectively formed on inner surfaces 21a and 21b close to each other that face each other through the cavity 7 between the first and second substrates 2A and 2B.

The stationary electrode 1 and movable electrode 3 are made of Pt/bonding strengthening films. The bonding strengthening film is made of Ti, V, Cr, Nb, Zr, Hf, Ta, or the like. In the first embodiment, the stationary electrode 1 and movable electrode 3 are made of Pt/Nb. In this case, as shown in FIG. 4a, each of the stationary electrode 1 and movable electrode 3 has a Pt upper layer and Nb lower layer.

The movable electrode 3 is made up of the sensing electrode 3A having pressure sensitivity, and reference electrode 3B having almost no pressure sensitivity. Movable electrode extraction pads 24 made of a conductive material are formed on electrode extraction portions 15A and 15B of the sensing electrode 3A and reference electrode 3B.

Each pad 24 is made of an Au/barrier layer/bonding strengthening film. The barrier layer is made of Pt, Ni, or the like. The bonding strengthening film is made of Ti, V, Cr, Nb, Zr, Hf, Ta, or the like, similar to the bonding strengthening film of the electrode. In the first embodiment, the pad 24 is made of Au/Pt/Nb. In this case, as shown in FIG. 4a, the pad 24 has an Au upper layer, Pt middle layer, and Nb lower layer.

The pads 24 are respectively connected to connection members for extracting the movable electrode 3 outside the sensor main body 2. The connection members are constituted by bonding connection pins 11 inserted through the electrode extraction holes 4b and 4c to the pads 24 with a bonding agent. As the bonding agent, a solder portion 12 or conductive paste is used. In particular, the solder portion 12 is made of Sn—Ag. The fused Sn—Ag solder portion 12 has very high wettability for Au forming the surface of the pad 24, and low wettability for Pt forming the surfaces of the stationary electrode 1 and movable electrode 3.

In connecting the connection pins 11, the connection pins 11 each having a lower end coated with the Sn—Ag solder portion 12 are press-inserted into the electrode extraction holes 4b and 4c to bring the Sn—Ag solder portions 12 into contact with the pads 24. The structure is heated to a predetermined temperature in this state to fuse the Sn—Ag solder portions 12. The Sn—Ag solder portions 12 are cooled to fix the connection pins 11 to the pads 24. Then, the sensing electrode 3A and reference electrode 3B are electrically connected to the connection pins 11 through the pads 24 and Sn—Ag solder portions 12.

In connecting the movable electrode 3 (3A and 3B) to the connection pins 11, the pads 24 each having an Au surface are formed on the electrode extraction portions 15A and 15B. The connection pins 11 are mechanically, electrically connected to the pads 24 through the Sn—Ag solder portions 12. Since the fused Sn—Ag solder portions 12 have very high wettability for the pads 24, the connection pins 11 can be connected with a satisfactory bonding strength. To the contrary, the Sn—Ag solder portions 12 have low wettability for the electrode material having a Pt surface. In other words, the Sn—Ag solder portions 12 hardly flow along the surfaces of the electrode extraction portions 15A and 15B. Hence, the Sn—Ag solder portions 12 do not contact the stationary electrode 1, and hardly short-circuit the stationary electrode 1 and movable electrode 3.

As shown in FIG. 5, a stationary electrode extraction conductive pad 25 is formed opposite the inner surface 21a of the first substrate 2A on the inner surface 21b of the second substrate 2B at a portion corresponding to an electrode extraction portion 14 of the first electrode 1. This pad 25 is made of the same material as the movable electrode pad 24. The pad 25 is connected to a stationary electrode connection pin 11 via an Sn—Ag solder portion (or conductive paste) 12 to form a connection member. The Sn—Ag solder portion 12 is brought into contact with the electrode extraction portion 14 of the stationary electrode 1 to electrically connect the stationary electrode 1 to the connection pin 11, thereby completing the electrostatic capacitance type pressure sensor.

Similar to connection between the movable electrode 3 and connection pin 11, the stationary electrode 1 and connection pin 11 are connected using the Sn—Ag solder portion 12 and Au/Pt/Nb pad 25. Since the fused Sn—Ag solder portion 12 has high wettability for the pad 25, the connection pin 11 can be connected with a satisfactory bonding strength. The Sn—Ag solder portion 12 spreads on the entire surface of the pad 25. In the pressure sensor 20 having the cavity 7 with a depth d of several μm, the Sn—Ag solder portion 12 spreads on the pad 25 so as to fill the cavity 7 by a capillary force, and comes into contact with the electrode extraction portion 14 of the stationary electrode 1. This can reliably electrically connect the stationary electrode 1 and connection pin 11. Since the Sn—Ag solder portion 12 has low wettability for the electrode material, the Sn—Ag solder member 12 does not contact the movable electrode 3, and does not short-circuit the stationary electrode 1 and movable electrode 3.

As described above, as the connection member formation method, the connection pin 11 having a lower end coated with the Sn—Ag solder portion 12 is press-inserted into the electrode extraction hole 4. However, the present invention is not limited to this, and may employ a method of inserting a solder ball or solder column into a desired electrode extraction hole when the second substrate 2B is in a wafer state before dicing, then inserting a connection pin, and heating the structure. This method can also attain the same effects as those of the above-described method, and can manufacture an electrostatic capacitance type pressure sensor having many electrode extraction structures formed at once.

A method of manufacturing the pressure sensor according to the first embodiment will be explained. FIGS. 6 and 7 respectively show sectional views of main steps in manufacturing the pressure sensor. Note that FIGS. 6 and 7 show steps in manufacturing a pressure sensor in which a cavity, electrode extraction hole, and stationary electrode are formed on one substrate, and the other substrate is used as a diaphragm.

Figure 6A:
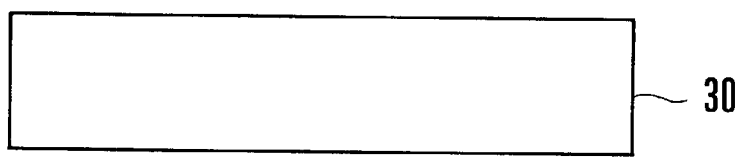
FIGS. 6(a) to 6(d) are sectional views, respectively, showing main steps in manufacturing a sensor.
Figure 6B:
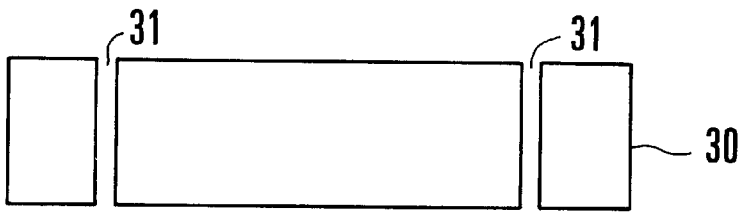

In manufacturing the pressure sensor, a thick sapphire wafer 30 is prepared (FIG. 6(a)). Electrode extraction holes 31 and atmospheric pressure inlet hole (not shown) are formed through the sapphire wafer 30 (FIG. 6(b)). These electrode extraction holes 31 and atmospheric pressure inlet hole are formed by machining, laser machining, ultrasonic machining, or the like.

Figure 6C:
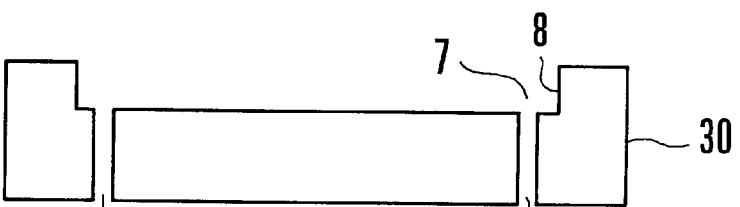

A recess 8 serving as a cavity 7 is formed to a desired depth in the inner surface of the sapphire wafer 30 (FIG. 6(c)). The recess 8 is formed by dry etching for a sapphire substrate material and by dry etching or wet etching for a glass or alumina substrate material. The planar shape of the cavity 7 may be circular, as shown in FIG. 2, or rectangular.

Figure 6D:
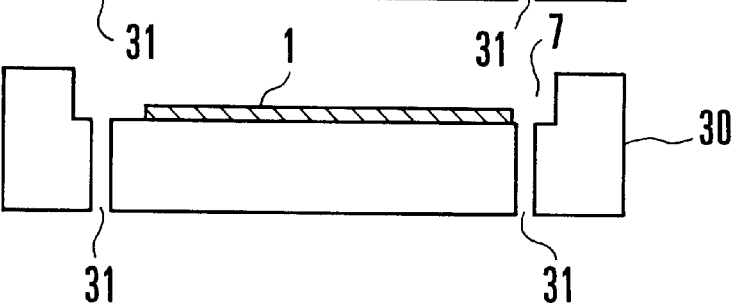

A stationary electrode 1 is formed at a desired position on the bottom surface of the recess 8 (FIG. 6(d)). The stationary electrode 1 is made of a Pt/bonding strengthening film. The bonding strengthening film is made of Ti, V, Cr, Nb, Zr, Hf, Ta, or the like. The bonding strengthening film is formed by vacuum evaporation, ion plating, sputtering, or the like. To form the bonding strengthening film into an electrode shape, the film is formed using a shadow mask or photolithography and etching.

A diaphragm wafer 35 is prepared (FIG. 7(a)). A movable electrode 3 is formed at a desired position on the inner surface of the diaphragm wafer 35 using the same material and method as those of the stationary electrode 1 (FIG. 7(b)).

Subsequently, electrode extraction pads 24 and 25 are formed (FIG. 7(c)). Each pad is made of an Au/barrier layer/bonding strengthening film such as an Au/Pt/Nb film. The pads 24 and 25 are formed by vacuum evaporation, ion plating, sputtering, or the like.

The substrates 30 and 35 are cleaned, and then directly bonded to each other at 400° C. to 1,300° C. to obtain a high bonding strength (FIG. 7(d)).

Finally, connection pins 11 each having a lower end coated with an Sn—Ag solder portion 12 are press-inserted into the electrode extraction holes 31, heated and fused at 240° C. to 300° C., and cooled to fix the connection pins 11 to the pads 24 and 25 (FIG. 7(e)). In this manner, the stationary electrode 1, connection pin 11, and pad 25, and the movable electrode 3, pad 24, and connection pin 11 are mechanically, electrically bonded.

The step of bonding the connection pin 11 is done after the wafer is divided into chips by dicing. Alternatively, the Sn—Ag solder portions 12 may be inserted and brought into contact with the electrodes before dicing in order to extract them at once. According to this method, columnar Sn—Ag solder preforms are inserted into the electrode extraction holes 31, and heated at 240° C. to 300° C. to extract electrodes in a wafer state. This realizes mass production depending on the packaging method.

(Second Embodiment)

Figure 8:
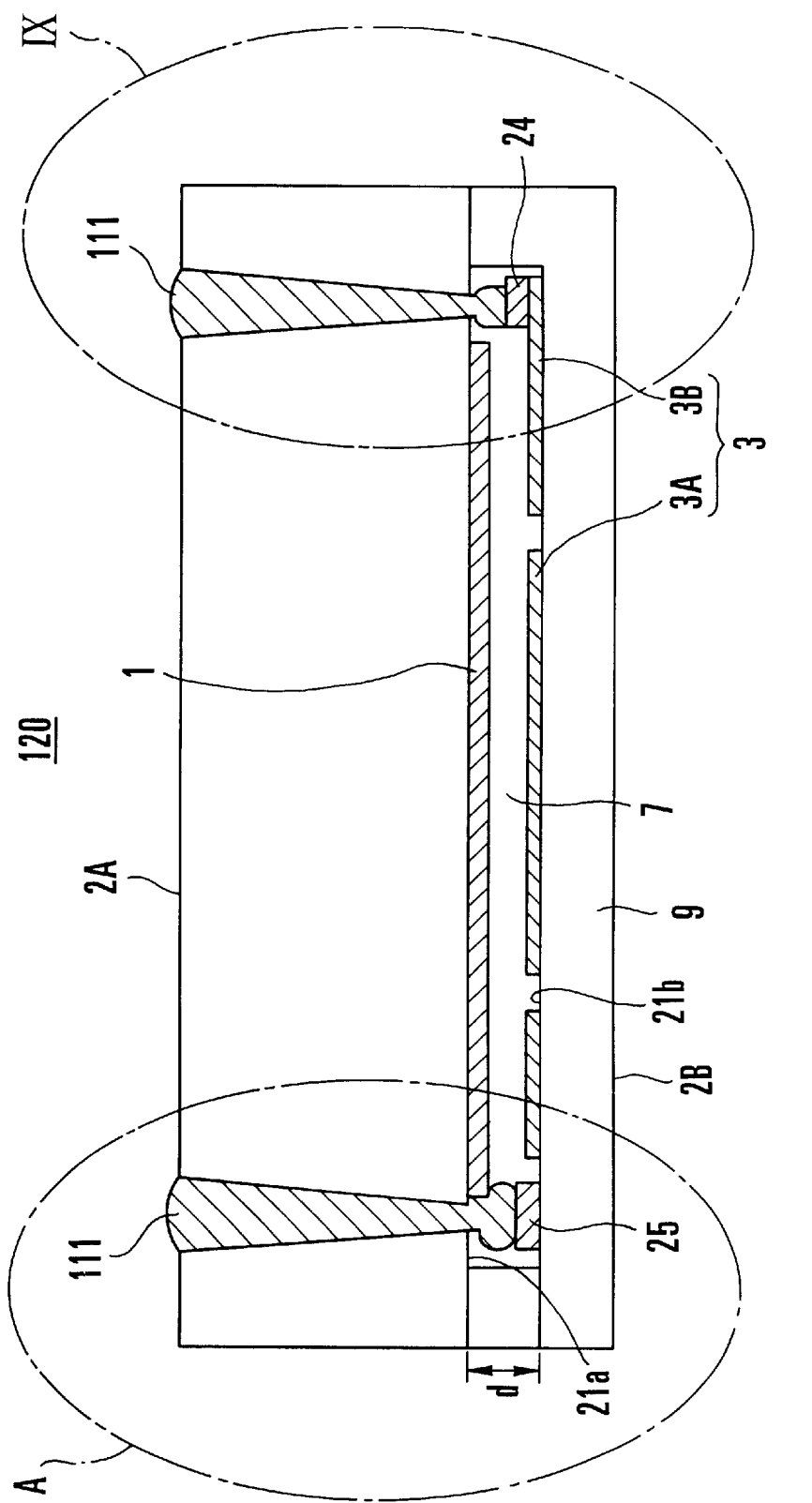
FIG. 8 is a sectional view showing a sensor according to the second embodiment of the present invention.
Figure 9:
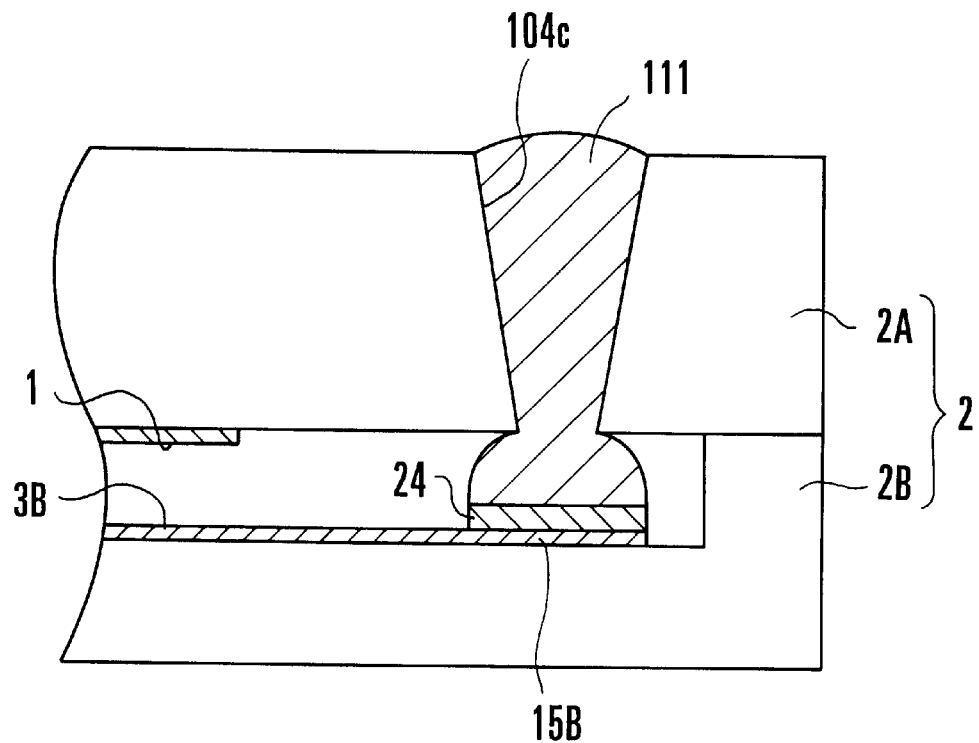
FIG. 9 is an enlarged sectional view showing the portion IX in FIG. 8.
Figure 10:
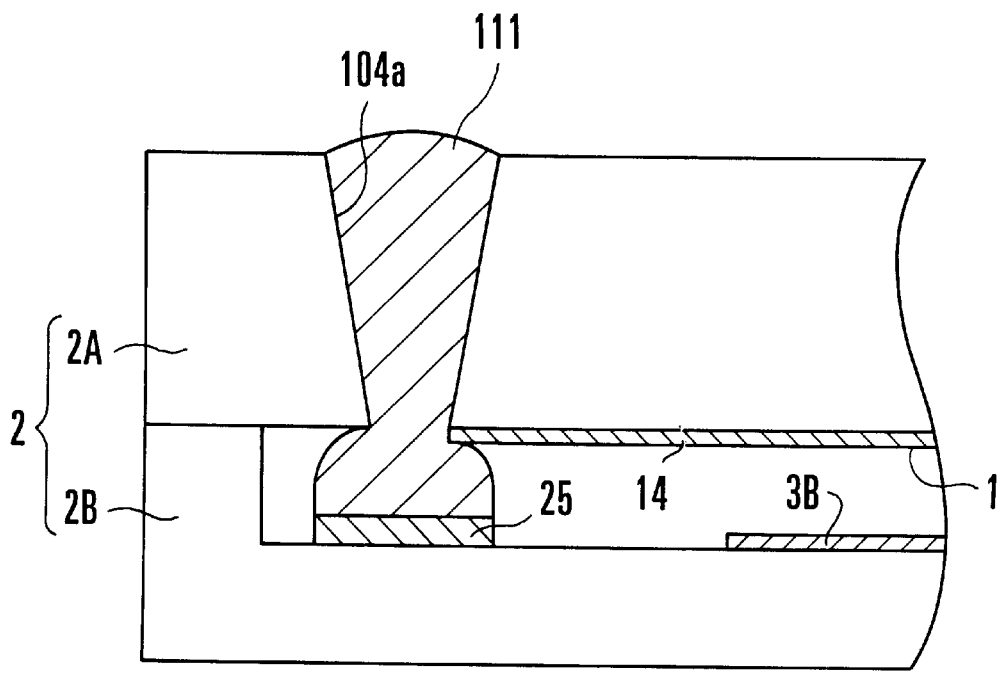
FIG. 10 is an enlarged sectional view showing the portion A in FIG. 8.

FIG. 8 is a sectional view showing a sensor according to the second embodiment of the present invention. FIG. 9 is an enlarged sectional view showing the portion IX in FIG. 8. FIG. 10 is an enlarged sectional view showing the portion A in FIG. 8. Similar to FIG. 1, FIG. 8 also shows an electrostatic capacitance type pressure sensor to which the present invention is applied. Note that the same reference numerals as in FIGS. 1 to 5 denote the same parts, and a description thereof will be omitted.

A pressure sensor 120 shown in FIG. 8 is different from the pressure sensor 20 shown in FIG. 1 in the structure of a connection member for extracting a stationary electrode 1 and movable electrode 3 in a cavity 7 outside a sensor main body 2. That is, electrode extraction holes 104a to 104c for communicating the cavity 7 with the outside are filled with solder portions 111 which are used as connection members.

Movable electrode extraction pads 24 are respectively formed on electrode extraction portions 15A and 15B of a sensing electrode 3A and reference electrode 3B. Each pad 24 is identical to that shown in FIG. 4, and made of, e.g., Au/Pt/Nb. The solder portion 111 also functioning as a bonding agent is made of the same material Sn—Ag as the solder portion 12.

Connection members for the movable electrode 3 are formed by flowing fused solder portions 111 in a sufficient amount into the electrode extraction holes 104b and 104c, and cooling the solder portions 111. At this time, since the fused solder portions 111 have very high wettability for the pads 24 having an Au surface, the solidified solder portions 111 are firmly bonded to the pads 24. On the other hand, the fused Sn—Ag solder portions 111 have low wettability for the electrode material having a Pt surface. Even if the flowed Sn—Ag solder portions 111 overflow from the pads 24, they hardly flow along the surfaces of the electrode extraction portions 15A and 15B, and do not short-circuit the stationary electrode 1 and movable electrode 3.

A stationary electrode extraction conductive pad 25 is formed at a portion corresponding to an electrode extraction portion 14 of the first electrode 1 on an inner surface 21b of a second substrate 2B. This pad 25 is made of the same material as the movable electrode pad 24.

A connection member for the stationary electrode 1 is formed similarly to the connection member for the movable electrode 3. The connection member and stationary electrode 1 are firmly bonded using the Sn—Ag solder portion 111 and pad 25 having an Au surface. Since the cavity 7 has the depth d of several μm, the Sn—Ag solder portion 111 spreads on the pad 25 so as to fill the cavity 7 by a capillary force, and comes into contact with the electrode extraction portion 14 of the stationary electrode 1. This can reliably electrically connect the stationary electrode 1 and the connection member made of the solder portion 111. Since the solder portion 111 has low wettability for the electrode material, the solder portion 111 does not short-circuit the stationary electrode 1 and movable electrode 3.

The electrode extraction holes 104a to 104c are tapered to decrease their inner diameters from the outer surface to inner surface of the first substrate 2A. The tapered shape can smoothly flow the fused solder portions 111. Note that even if the electrode extraction holes 111 are not tapered, the fused solder portions 111 can be flowed. Thus, the electrode extraction holes need not always be tapered.

A method of manufacturing the pressure sensor according to the second embodiment will be explained. FIG. 11 shows sectional views of main steps in manufacturing the pressure sensor. Note that FIG. 11 shows steps in manufacturing a pressure sensor in which a cavity, electrode extraction hole, and stationary electrode are formed on one substrate, and the other substrate is used as a diaphragm.

Figure 11A:
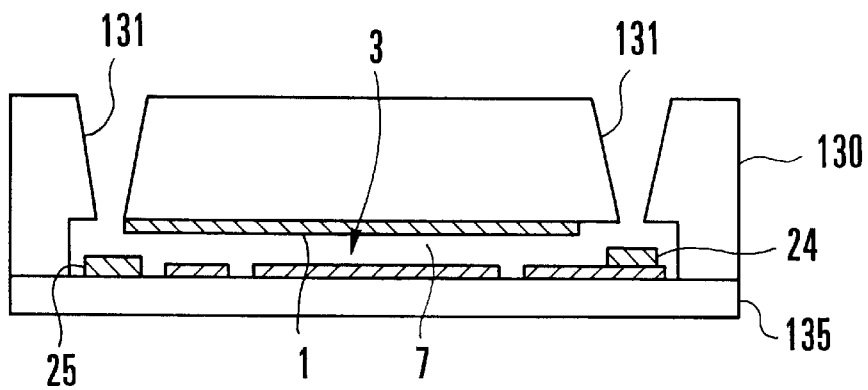
FIGS. 11(a) to 11(c) are sectional views, respectively, showing main steps in manufacturing a sensor.
Figure 11B:
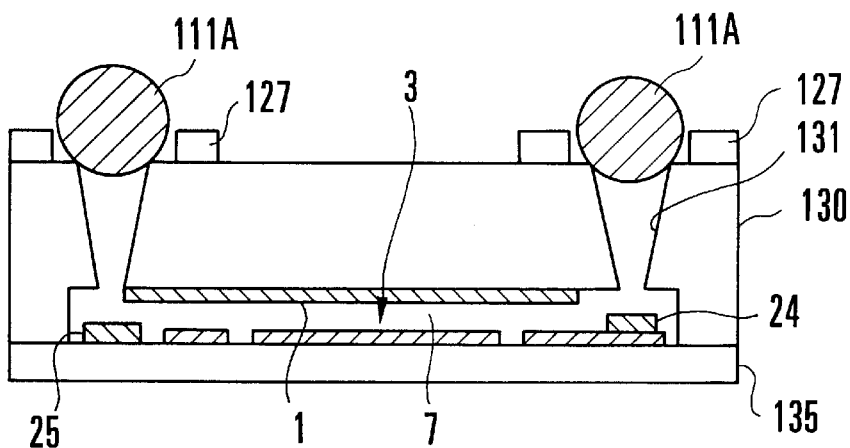
Figure 11C:
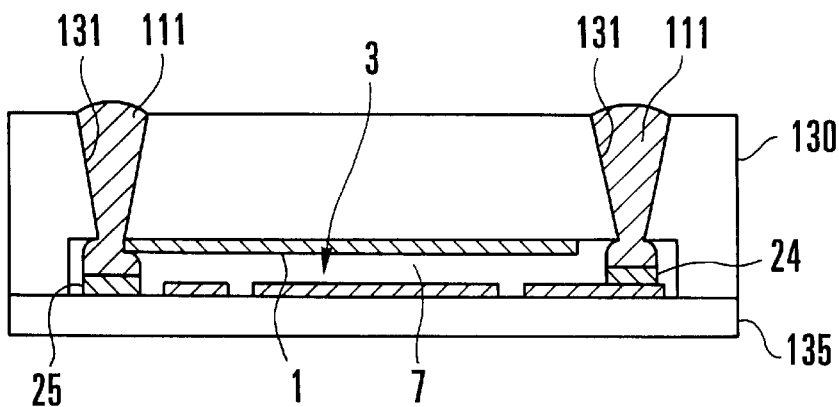
Figure 12:
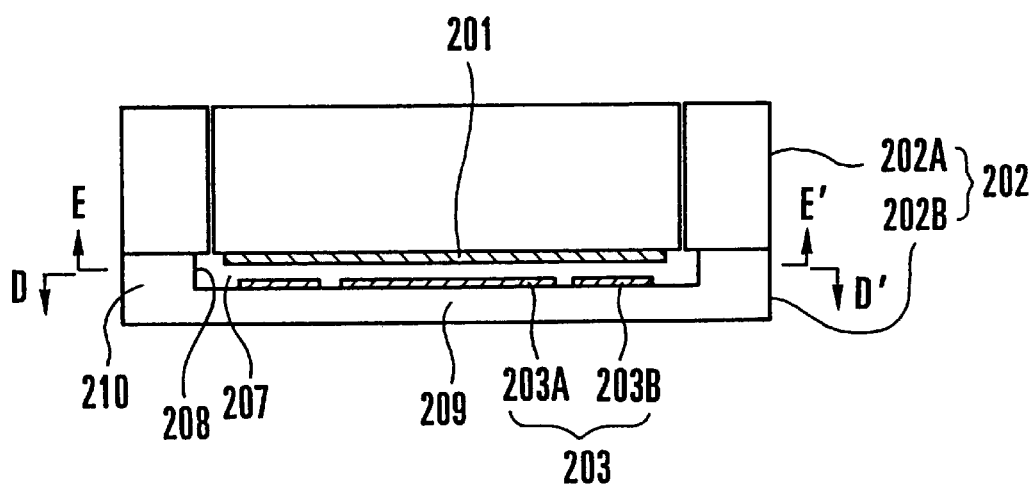
FIG. 12 is a sectional view showing a conventional pressure sensor.
Figure 13:
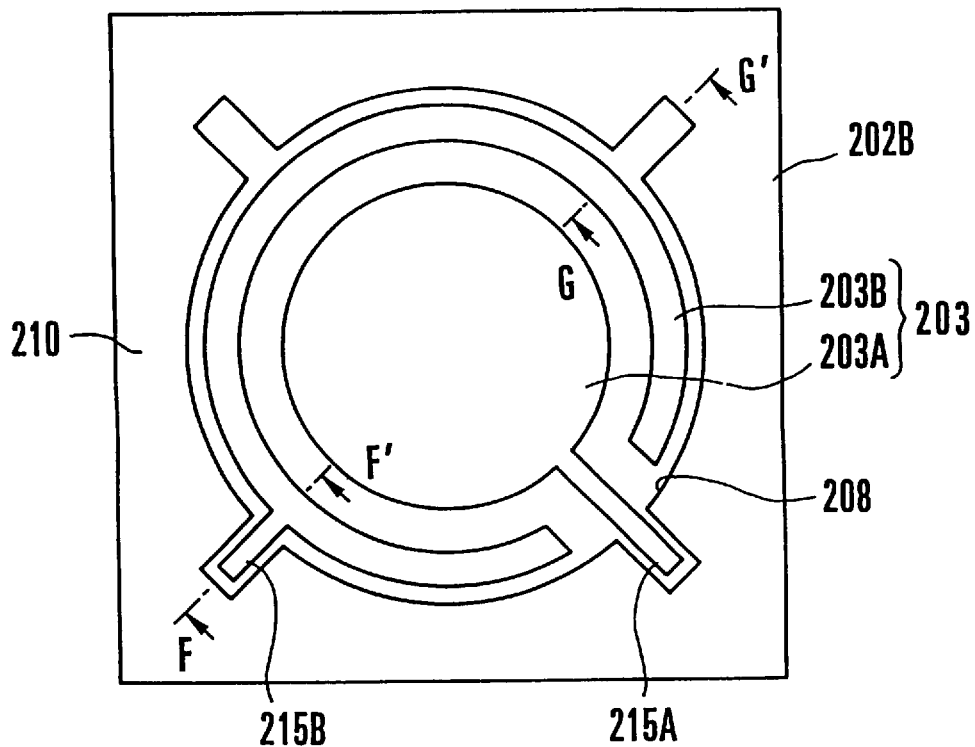
FIG. 13 is a sectional view taken along the line D–D' in FIG. 12.
Figure 14:
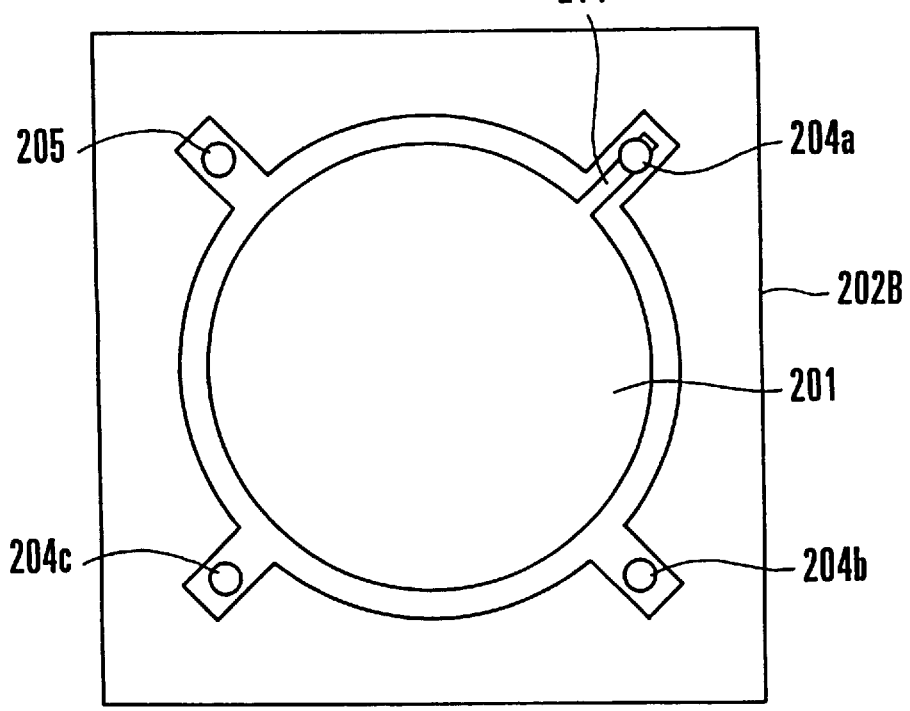
FIG. 14 is a sectional view taken along the line E–E' in FIG. 12.
Figure 15:
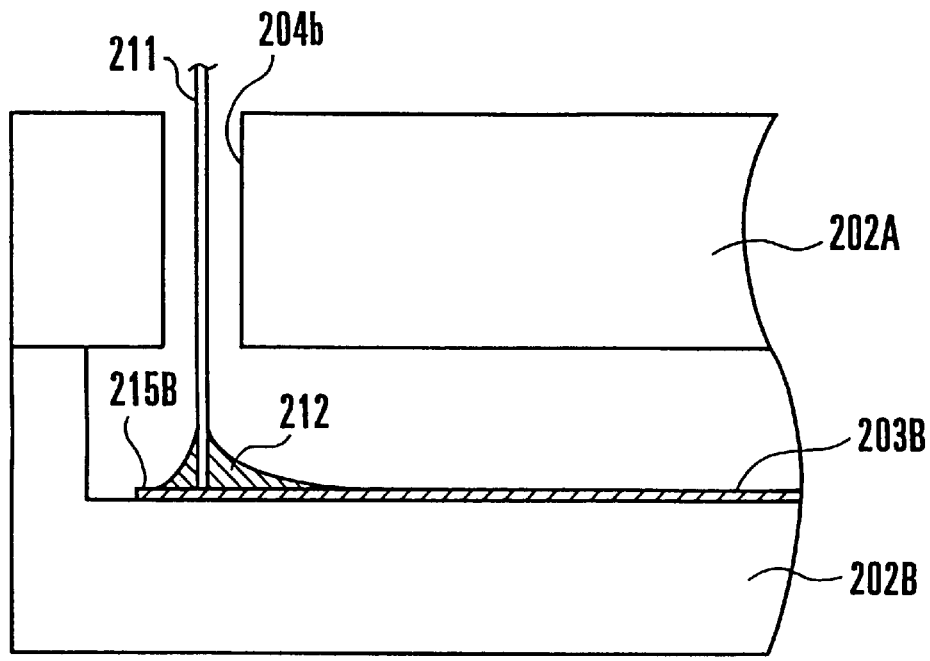
FIG. 15 is an enlarged sectional view taken along the line F–F' in FIG. 13.
Figure 16:
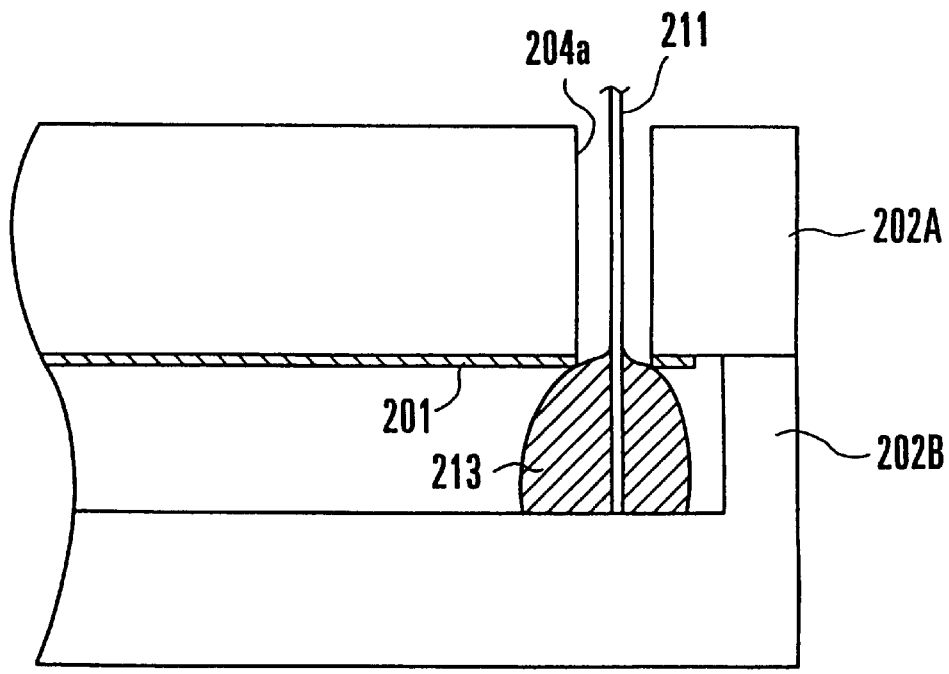
FIG. 16 is an enlarged sectional view taken along the line G–G' in FIG. 13.

A member shown in FIG. 11(a) is prepared. This member is formed by the same method as shown in FIGS. 6(a) to 6(d) and FIGS. 7(a) to 7(d). The inner diameter of each electrode extraction hole 131 is about 50 to 500 μm, and the height from the pad 24 or 25 to the outlet (a portion on the inner surface of a first substrate 130 forming the cavity 7) of the electrode extraction hole 131 is about 300 to 700 μm. To taper the electrode extraction hole 131, as shown in FIG. 11(a), the electrode extraction hole 131 is formed through the first substrate 130 using laser machining.

An Sn—Ag solder ball 111A is disposed in the inlet (a portion on the outer surface of the first substrate 130) of the electrode extraction hole 131. The size of the solder ball 111A as a solder lump is determined to fill the space above the pad 24 or 25 in the cavity 7 and the electrode extraction hole 131 with the solder portion 111 to be fused in the next step. The diameter of the solder ball 111A is larger than the inner diameter of the inlet of the electrode extraction hole 131, so the solder ball 111A does not fall into the cavity 7. If a jig 127 is attached around the inlet of the electrode extraction hole 131, the solder ball 111A can be easily disposed at a desired position (FIG. 11(b)).

The sensor main body is heated at 240° C. to 300° C. to fuse the solder ball 111A and flow it onto the pad 24 or 25 through the electrode extraction hole 131. This solder portion 111 is used as a connection member. The jig 127 is finally removed to complete the pressure sensor (FIG. 11(c)).

Under the above conditions (the inner diameter of the electrode extraction hole 131, the height from the pad 24 or 25 to the outlet of the electrode extraction hole 131, and the temperature), the fused solder portion 111 reaches the pad 24 or 25 from the electrode extraction hole 131 by the own weight. However, depending on the inner diameter of the electrode extraction hole 131, the composition of the solder portion 111, and the like, the fused solder portion 111 may not flow into the cavity 7 by its own weight due to the surface tension of the solder portion 111, the coefficient of friction on the inner surface of the electrode extraction hole 131, and the like. In this case, the inflow of the fused solder portion 111 is prompted by the following method.

First, the difference between the external pressure of the sensor main body 2 and the internal pressure of the cavity 7 is used. In the step shown in FIG. 11(b), each electrode extraction hole 131 is covered with the solder ball 111A. If an atmospheric pressure inlet hole (see the atmospheric pressure inlet hole 5 in FIG. 3) exists, this hole is covered to close the cavity 7. The structure is heated in this state while the external pressure of the sensor main body 2 is set sufficiently high. Then, the fused solder portion 111 can be forcibly introduced from the electrode extraction hole 131 into the cavity 7 by the pressure difference on the two sides of the electrode extraction hole 131. Moreover, when the atmospheric pressure inlet hole exists, the interior of the cavity 7 is evacuated through this hole to reduce the internal pressure of the cavity 7, which can also attain the same effect.

Second, the wettability on the inner surface of the electrode extraction hole 131 is increased. For example, the wettability of the fused solder portion 111 can be increased by covering the inner surface of the electrode extraction hole 131 with an Au film. Thus, the fused solder portion 111 easily flows. The same effect can also be obtained by covering only a portion around the inlet of the electrode extraction hole 131 with an Au film.

In the above embodiments, the present invention is applied to an electrostatic capacitance type pressure sensor. However, the present invention is not limited to this, and can be applied to any sensor such as a capacitance type acceleration sensor so long as an electrode formed in the cavity of a sensor main body is extracted to the outside.

The cavity is formed by forming a recess in one of two substrates. Instead, the cavity may be formed by interposing a spacer between two substrates.

As has been described above, in the sensor of the present invention, an electrode is extracted using a connection member having low wettability for the electrode and a pad having high wettability for the electrode. This can firmly bond the connection member and electrode. At the same time, the electrode and connection member can be reliably electrically connected without flowing part of the fused connection member onto the electrode surface or short-circuiting electrodes. Accordingly, a sensor higher in yield and more excellent in mass production than the conventional sensor can be realized.

In this case, the connection member and electrode can be more reliably electrically connected by bonding a connection pin to a pad with a bonding agent to form the connection member.

The connection member can be easily formed by filling an electrode extraction hole with solder and using the solder as the connection member.

At this time, if the electrode extraction hole is tapered, the fused solder can flow smoothly.

If the inner surface of the electrode extraction hole is covered with a material having high wettability for the solder, the connection member made from the buried solder can be reliably formed.

According to the sensor manufacturing method of the present invention, the fused solder is flowed from the electrode extraction hole onto the pad. The electrode extraction hole is filled with the fused solder, cooled, and buried with the solder. Using this solder as a connection member facilitates formation of the connection member.

If the electrode extraction hole is formed using laser machining in this manufacturing method, the electrode extraction hole can be tapered to smoothly flow the fused solder.

What is claimed is:

1. A sensor comprising:
   a sensor main body in which a cavity which communicates with outside through at least one electrode extraction hole is formed;
   a first electrode arranged in the cavity to face a second electrode;
   at least one connection member inserted in the cavity through the electrode extraction hole; and
   at least one pad formed in the cavity and disposed between said connection member and one of said first and second electrodes, said connection member to electrically couple to said one of said first and second electrodes via said pad, said pad to face the electrode extraction hole, and bonded to said connection member, and made of a conductive material, wherein wettability of said connection member for a surface of said pad is higher than wettability of said connection member for a surface of each of said electrode.

2. A sensor according to claim 1, wherein said pad is formed on each of said surface of each of said electrodes at a position where said electrode faces the electrode extraction hole, and said electrode is connected to said connection member through said pad.

3. A sensor according to claim 2, wherein said connection member comprises:
   a connection pin inserted through the cavity from the electrode extraction hole; and
   a bonding agent for bonding said connection pin to said pad.

4. A sensor according to claim 3, wherein the bonding agent is made of Sn—Ag, the surface of each of said electrodes is made of Pt, and the surface of said pad is made of Au.

5. A sensor according to claim 1, wherein said pad is located at a first side of an inner surface of said sensor main body, said first side opposite said electrode extraction hole, said inner surface forming the cavity, said pad facing the electrode extraction hole, and each of said electrodes located at a second side of said inner surface, said second side opposite said pad, each of said electrodes to contact said connection member.

6. A sensor according to claim 5, wherein said connection member comprises:
   a connection pin inserted into the cavity from the electrode extraction hole; and
   a bonding agent for bonding said connection pin to said pad.

7. A sensor according to claim 6, wherein the bonding agent is made of Sn—Ag, the surface of each of said electrodes is made of Pt, and the surface of said pad is made of Au.

8. A sensor according to claim 1, wherein said connection member is made of solder for filling a space above said pad in the cavity.

9. A sensor according to claim 8, wherein the solder is made of Sn—Ag, the surface of each of said electrodes is made of Pt, and the surface of said pad is made of Au.

10. A sensor according to claim 8, wherein the electrode extraction hole is tapered to decrease an inner diameter from an outer surface to an inner surface of said sensor main body.

11. A sensor according to claim 8, wherein at least part of an inner surface of the electrode extraction hole is covered with a material having high wettability for the solder.

* * * * *